United States Patent
Lee et al.

(10) Patent No.: US 6,218,271 B1
(45) Date of Patent: Apr. 17, 2001

(54) METHOD OF FORMING A LANDING PAD ON THE DRAIN AND SOURCE OF A MOS TRANSISTOR

(75) Inventors: Tzung-Han Lee, Taipei; Kun-Chi Lin, Hisn-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/414,901

(22) Filed: Oct. 8, 1999

(51) Int. Cl.⁷ ................. H01L 21/3205; H01L 21/4763; H01L 21/44

(52) U.S. Cl. ................. 438/585; 438/595; 438/666; 438/672

(58) Field of Search ................. 438/257, 279, 438/585, 595, 666, 672, 301

(56) References Cited

U.S. PATENT DOCUMENTS

| | | | |
|---|---|---|---|
| 4,502,210 | * 3/1985 | Okumura et al. | 29/591 |
| 4,637,128 | * 1/1987 | Mizutani | 29/576 B |
| 5,164,330 | * 11/1992 | Davis et al. | 437/192 |
| 5,378,652 | * 1/1995 | Samata et al. | 437/189 |
| 5,397,742 | * 3/1995 | Kim | 437/190 |
| 5,683,924 | * 11/1997 | Chan et al. | 437/44 |
| 5,783,471 | * 7/1998 | Chu | 438/257 |
| 6,090,695 | * 7/2000 | Lee et al. | 438/597 |
| 6,124,192 | * 9/2000 | Jeng et al. | 438/597 |

\* cited by examiner

*Primary Examiner*—John F. Niebling
*Assistant Examiner*—Walter L. Lindsay, Jr.
(74) *Attorney, Agent, or Firm*—Winston Hsu

(57) ABSTRACT

This invention provides a method of forming a landing pad on the drain and source of a MOS transistor. The MOS transistor is formed on a silicon substrate of a semiconductor wafer and comprises a gate on the silicon substrate with a spacer around its periphery portion, a drain and a source on the surface of the silicon substrate and on opposite sides of the gate. The method comprises forming a conductive layer of uniform thickness above the drain or source of the MOS transistor. The conductive layer is used as the landing pads for the drain or source. The height of the conductive layer is lower than that of the spacer surrounding the gate so that the spacer electrically isolates the gate and the conductive layer.

10 Claims, 9 Drawing Sheets

METHOD OF FORMING A LANDING PAD ON THE DRAIN AND SOURCE OF A MOS TRANSISTOR

BACKGROUND OF THE INVENTION

1. Field of the Invention

The present invention relates to a method of forming a landing pad, and more particularly, to a method of forming a landing pad on the drain and source of a MOS transistor.

2. Description of the Prior Art

A memory cell of a dynamic random access memory (DRAM) is formed with a metal oxide semiconductor (MOS) transistor, a capacitor and a node contact. The MOS transistor is used as the pass transistor of the memory cell for controlling the transmission of electric charge. The capacitor is used for storing electric charge to memorize and output data. The node contact is one type of contact plug for electrically connecting the MOS transistor and the capacitor. As the size of semiconductor devices decreases, it becomes increasingly difficult to form the node contact using only an etching and deposition processes. Therefore, in current semiconductor processes, a landing pad and another contact plug are formed at the bottom of the node contact to reduce the difficulty in the formation of the node contact and to ensure the electrical performance of the DRAM.

Please refer to FIG. 1 to FIG. 5. FIG. 1 to FIG. 5 are schematic diagrams for a prior art method of forming a landing pad 29. The prior art method of forming the landing pad 29 is performed on a semiconductor wafer 10, which employs a first photoresist layer 20 and a second photoresist layer 28 to define the positions of a contact plug 27 and the landing pad 29. As shown in FIG. 1, the semiconductor wafer 10 comprises a silicon substrate 12, a first dielectric layer 18 positioned on the silicon substrate 12, and a first photoresist layer 20 positioned on the first dielectric layer 18. Two gates 14, 16 are positioned on the silicon substrate 12 and covered by the first dielectric layer 18, with two spacers 17 positioned around their peripheries respectively. The first photoresist layer 20 comprises an opening 22 extending down to the surface of the first dielectric layer 18 and is positioned between the two gates 14, 16 for defining the position of the contact plug 27.

As shown in FIG. 2, an anisotropic etching process is first performed to vertically remove the first dielectric layer 18 under the opening 22 to form a contact hole 24. Then, a stripping process is performed to remove the first photoresist layer 20 on the dielectric layer 18. Next, as shown in FIG. 3, a polysilicon layer 26 is formed on the semiconductor wafer 10 to fill the contact hole 24. Next, as shown in FIG. 4, a second photoresist layer 28 is formed on a predetermined area of the semiconductor wafer 10 above the contact hole 24 for defining the position of the landing pad 29.

Finally, as shown in FIG. 5, the polysilicon layer 26 not covered by the second photoresist layer 28 is removed and the residual polysilicon layer 26 becomes a conductive layer 26a. After the second photoresist layer 28 is removed, the landing pad 29 is completed. The top of the conductive layer 26a is used as the landing pad 29 and the bottom of the conductive layer 26a is used as the contact plug 27 for electrically connecting the landing pad 29 and the drain/source positioned under the silicon substrate 12.

Please refer to FIG. 6. FIG. 6 is a sectional schematic diagram of a capacitor formed on the landing pad 29 shown in FIG. 5. In DRAM processing, the surface of the semiconductor wafer 10 is usually defined and differentiated as an array area 11 where the memory cells of the DRAM are formed and a periphery area 13 where the periphery circuits are formed. After the gates 14, 16 are formed in the array area 11 and at least one gate 15 is formed in the periphery area 13, the landing pad 29 and a capacitor are formed in the array area 11. Then, an interconnecting process is performed in the array area 11 and the periphery area 13 at the same time for electrically connecting the memory cell and the periphery circuits with external circuitry.

According to the above-mentioned DRAM process, a second dielectric layer 30, a node contact 31, a bottom storage node 32, a third dielectric layer 33 and an upper field plate 34 are sequentially formed after the landing pad 29 is completed in the array area 11. The bottom storage node 32, the third dielectric layer 33 and the upper field plate 34 form a capacitor 39. One of the gates 14, 16, the contact plug 27, the landing pad 29 the node contact 31 and the capacitor 34 form a memory cell 40.

Next, the interconnecting process is performed to form a fourth dielectric layer 35 on the semiconductor wafer 10 followed by an etching process. Therefore, a first groove (not showed) extending down to the upper field plate 34 is formed in the array area 11 as a channel for electrically connecting the memory cell with external circuitry. At the same time, a second groove 38 extending down to the silicon substrate 12 is formed in the periphery area 13 as another channel for electrically connecting the periphery circuits with external circuitry.

In the prior art method, the lithographic process must be performed twice in forming the first photoresist layer 20 and the second photoresist layer 28 to define the position of the landing pad 29. Consequently, the entire process is complicated and difficult to control. In addition, the sequentially formed node contact 31 may electrically interact with a bit line (not shown) within the second dielectric layer 30, leading to a defect.

Furthermore, the landing pad 29 is formed on the first dielectric layer 18 and is electrically connected to the silicon substrate 12 with the contact plug 27 inlayed in the first dielectric layer 18. Consequently, the thickness of the memory cell 40 subsequently formed in the array area 11 will be very large. Therefore, the distance from the surface of the fourth dielectric layer 35 to the surface of the silicon substrate 12 will then be quite long, increasing the difficulty in forming the second groove 38.

SUMMARY OF THE INVENTION

It is therefore a primary objective of the present invention to provide a method of forming a landing pad on the drain and source of a MOS transistor without using any photoresist layers to define the position of the landing pad, and which also has the benefit of decreasing the depth of the second groove subsequently formed in a periphery area.

In a preferred embodiment, the present invention provides a method of forming a landing pad on the drain and source of a metal oxide semiconductor (MOS) transistor. The MOS transistor is formed on a silicon substrate of a semiconductor wafer and comprises a gate positioned on the silicon substrate with a spacer positioned around its periphery. A drain and a source are also formed on the surface of the silicon substrate and are positioned on opposite sides of the gate. The method comprises:

forming a conductive layer of a uniform thickness above the drain and source of the MOS transistor wherein the conductive layer is used as the landing pads for the drain and source, and the height of the conductive layer is lower than that of the spacer surrounding the periphery of the gate so that the gate and the conductive layer are electrically isolated by the spacer. On top of this conductive layer is a silicide layer to reduce the resistance of the conductive layer.

It is an advantage of the present invention that the conductive layer and the silicide layer evenly formed on the predetermined area of the silicon substrate are used as the landing pad of the drain or source of the MOS transistor. This defines the position of the landing pad without any need for a lithographic process, and enhances the tolerance in defining the position of the bit contact and the node contact in the array area. Consequently, the complexity of the DRAM process is reduced, improving the performance and integration of the DRAM.

This and other objectives of the present invention will no doubt become obvious to those of ordinary skill in the art after having read the following detailed description of the preferred embodiment which is illustrated in the various figures and drawings.

BRIEF DESCRIPTION THE DRAWINGS

DETAILED DESCRIPTION OF THE PREFERRED EMBODIMENT

Figure 1:
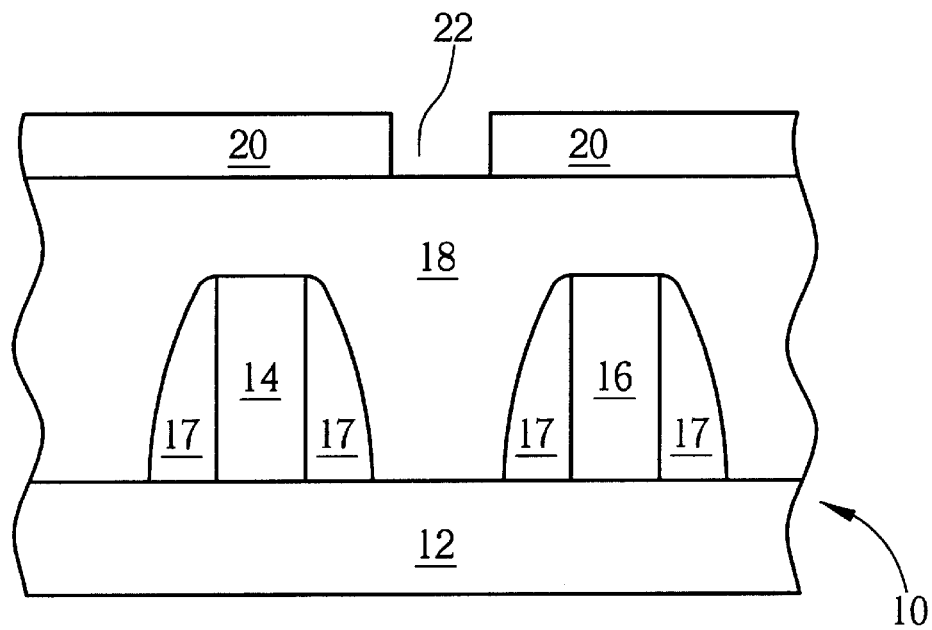
FIG. 1 to FIG. 5 are schematic diagrams of a prior art method of forming a landing pad.
Figure 2:
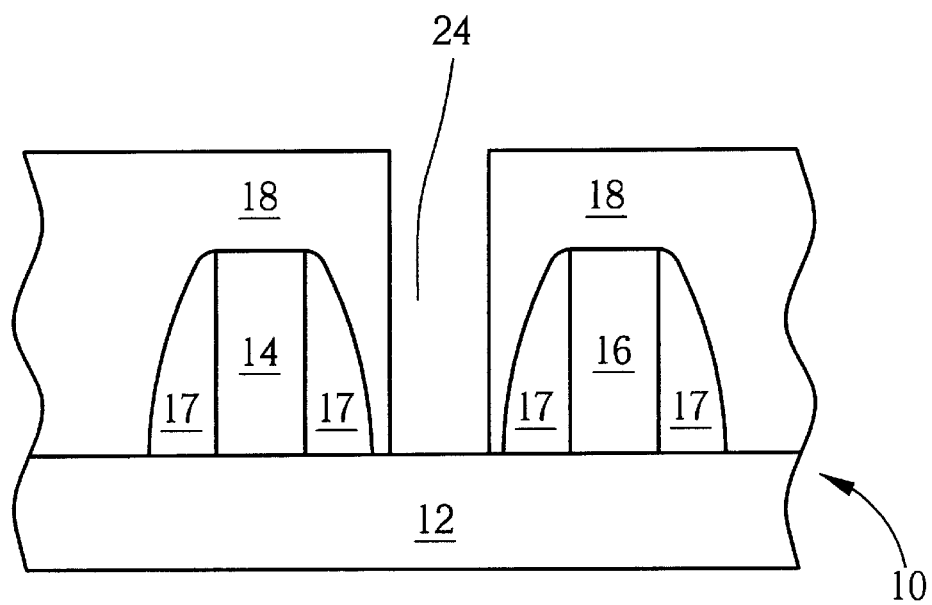
Figure 3:
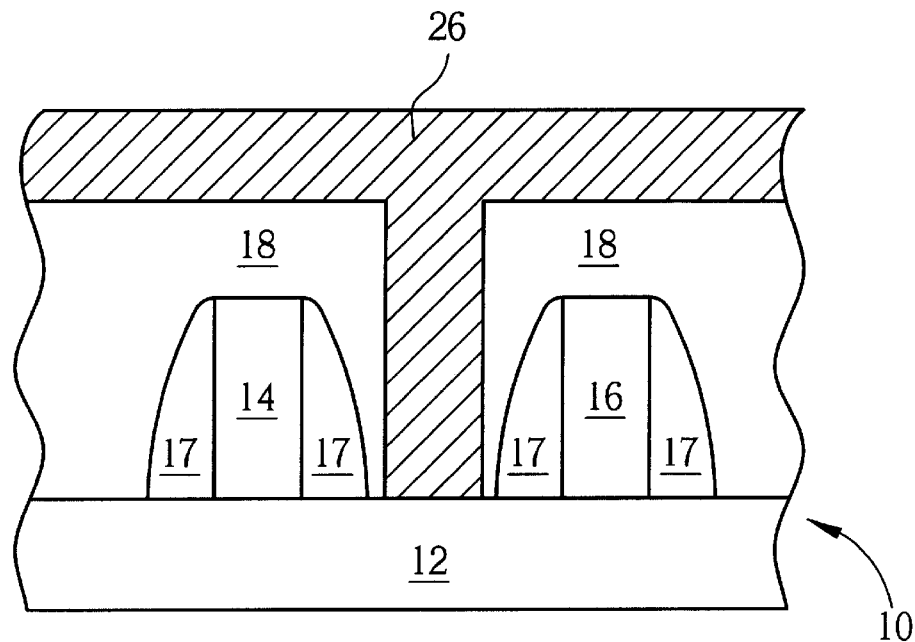
Figure 4:
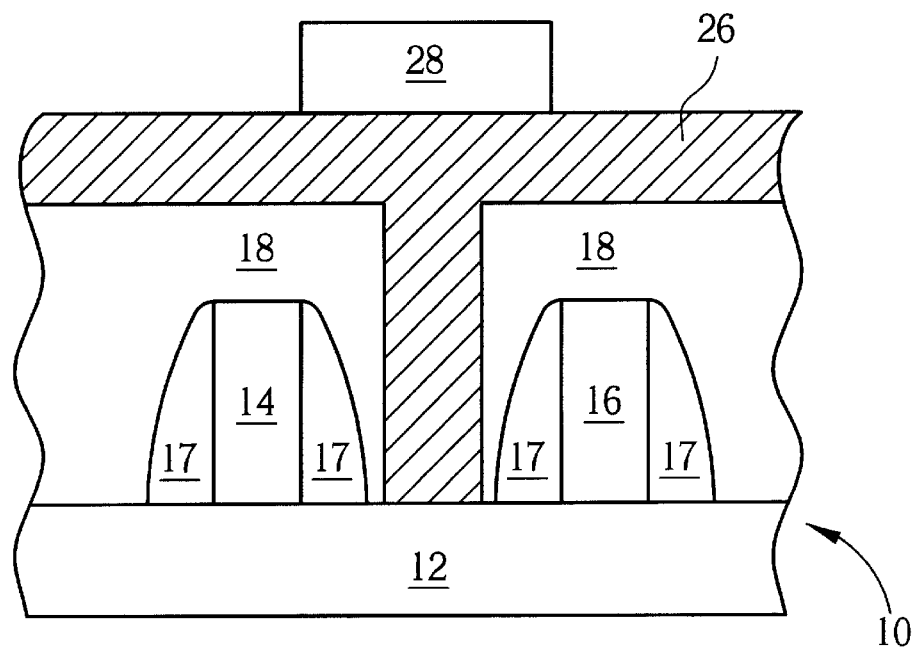
Figure 5:
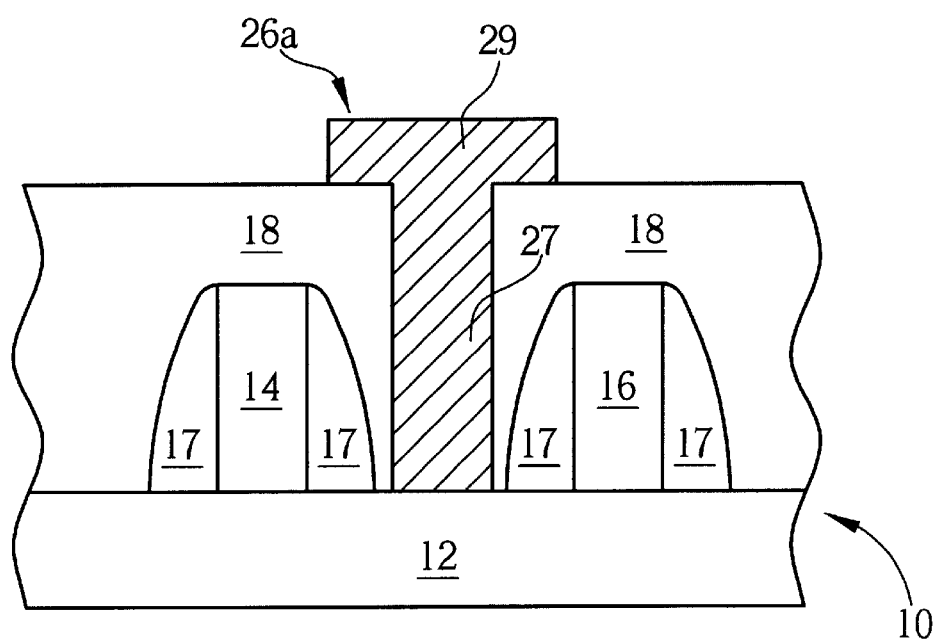
Figure 6:
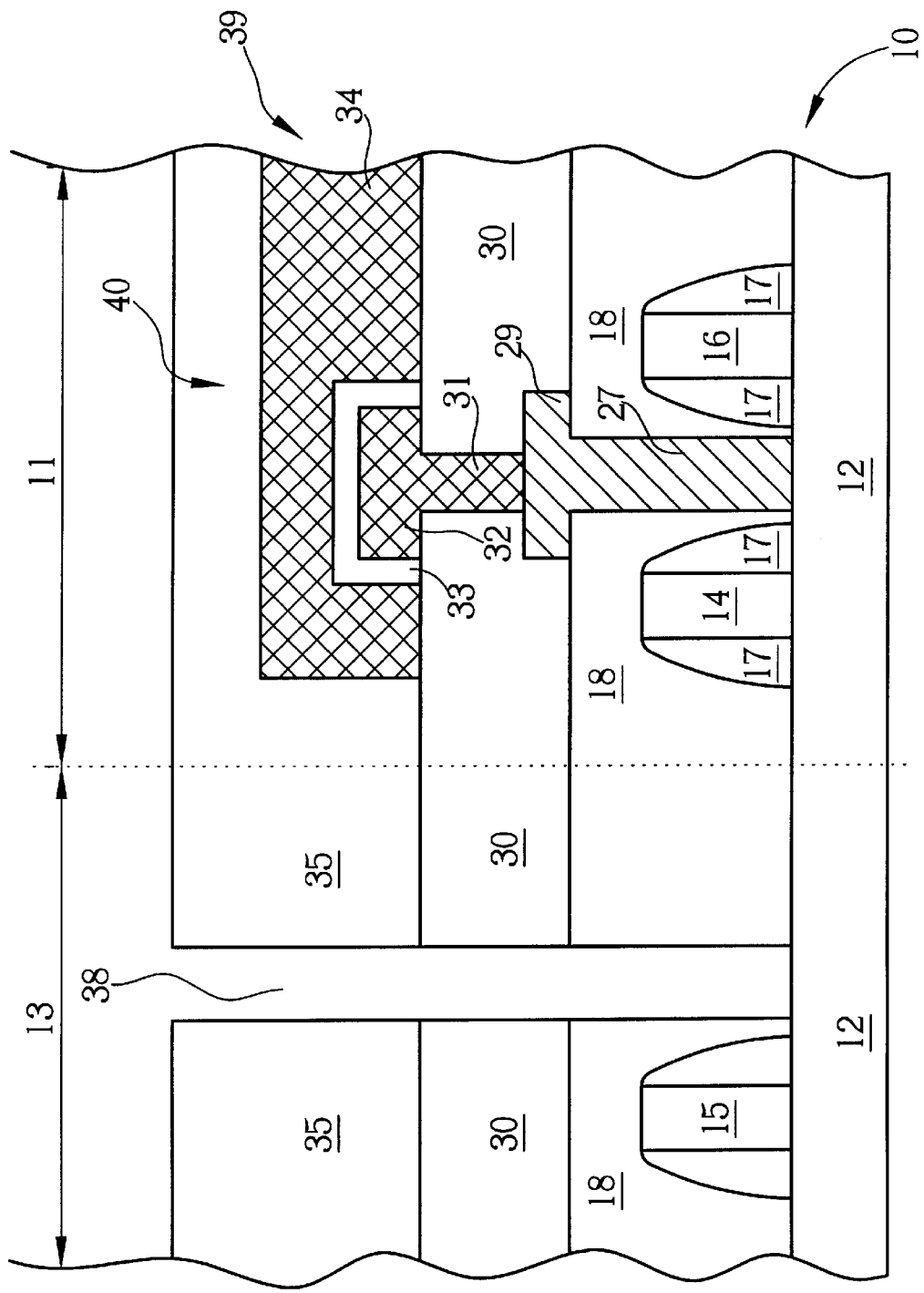
FIG. 6 is a sectional schematic diagram of a capacitor formed on the landing pad showed in FIG. 5.
Figure 7:
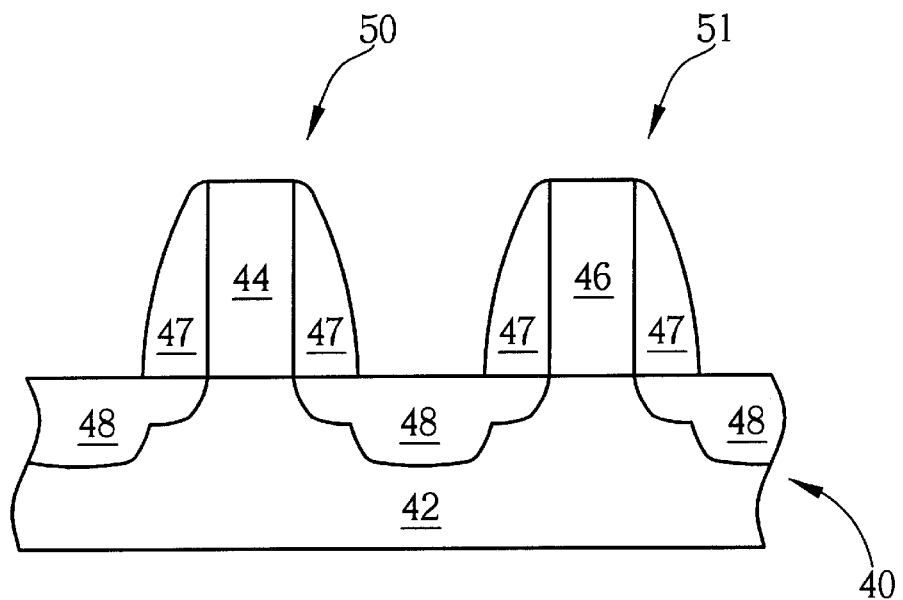
FIG. 7 to FIG. 9 are schematic diagrams of a method of forming a landing pad on the drain and source of a MOS transistor according to the present invention.
Figure 8:
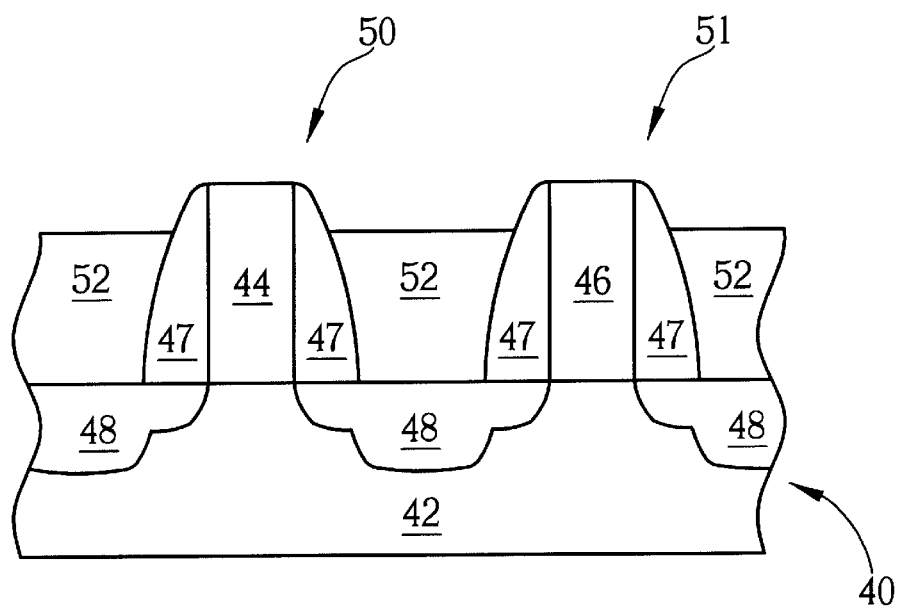
Figure 9:
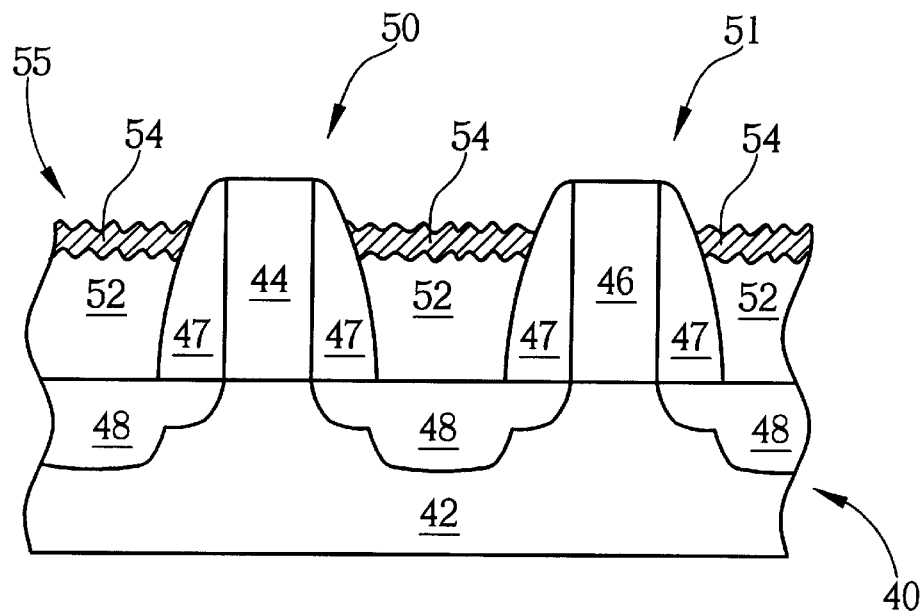

Please refer to FIG. 7 to FIG. 9. FIG. 7 to FIG. 9 are schematic diagrams of a method of forming a landing pad 55 on the drain and source 48 of a MOS transistor 50 according to the present invention. The present invention method of forming a landing pad 55 on the drain and source 48 of two MOS transistors 50, 51 is performed on a semiconductor wafer 40. As shown in FIG. 7, the semiconductor wafer 40 comprises a silicon substrate 42 and the MOS transistors 50, 51 positioned on the silicon substrate 42 wherein each of the MOS transistors 50, 51 is used as a pass transistor of a memory cell of a DRAM. Each of the MOS transistor 50, 51 comprises a gate 44, 46 respectively positioned on the silicon substrate 42 with, and at least a drain or source 48 formed on the surface of the silicon substrate 42 and positioned on opposite sides of the gates 44, 46. Each of the gate 44, 46 has a spacer 47 positioned around it periphery.

As shown in FIG. 8, a conductive layer 52 of uniform thickness is first formed from a poly-silicon layer or an epitaxy layer. This layer is formed above each drain and source 48 of the MOS transistors 50, 51 wherein the height of the conductive layer 52 is lower than that of the spacer 47 so that the gates 44, 46 and the conductive layer 52 are isolated by the spacer 47 to prevent short-circuiting. Then, an ion implantation process is performed to implant certain IIIA-group dopants such as boron (B) ions or VA-group dopants such as arsenic (As) ions into the conductive layer 52 to reduce the resistance of the conductive layer 52.

Next, as shown in FIG. 9, a self-aligned silicide (salicide) process is performed to form a silicide layer 54 on the conductive layer 52. During the salicide process, a tungsten layer (not showed) is first deposited on the semiconductor wafer 40. Then, a thermal process is performed to react the tungsten layer with the conductive layer 52 to form tungsten silicon ($WSi_x$) that becomes the silicide layer 54 for reducing the sheet resistance of the conductive layer 52. Finally, a wet etching process is performed to remove the unreacted tungsten layer, leaving the silicide layer 54 and the conductive layer 52 and thereby completing the landing pads 55.

Figure 10:
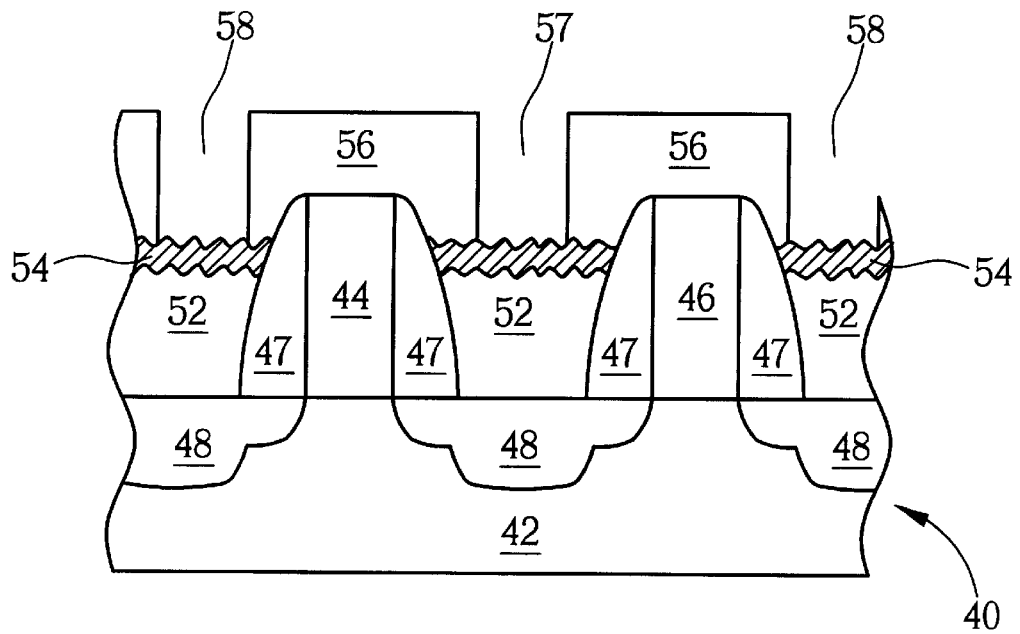
FIG. 10 and FIG. 11 are schematic diagrams of a method of forming a bit contact and a node contact on the landing pad showed in FIG. 9.
Figure 11:
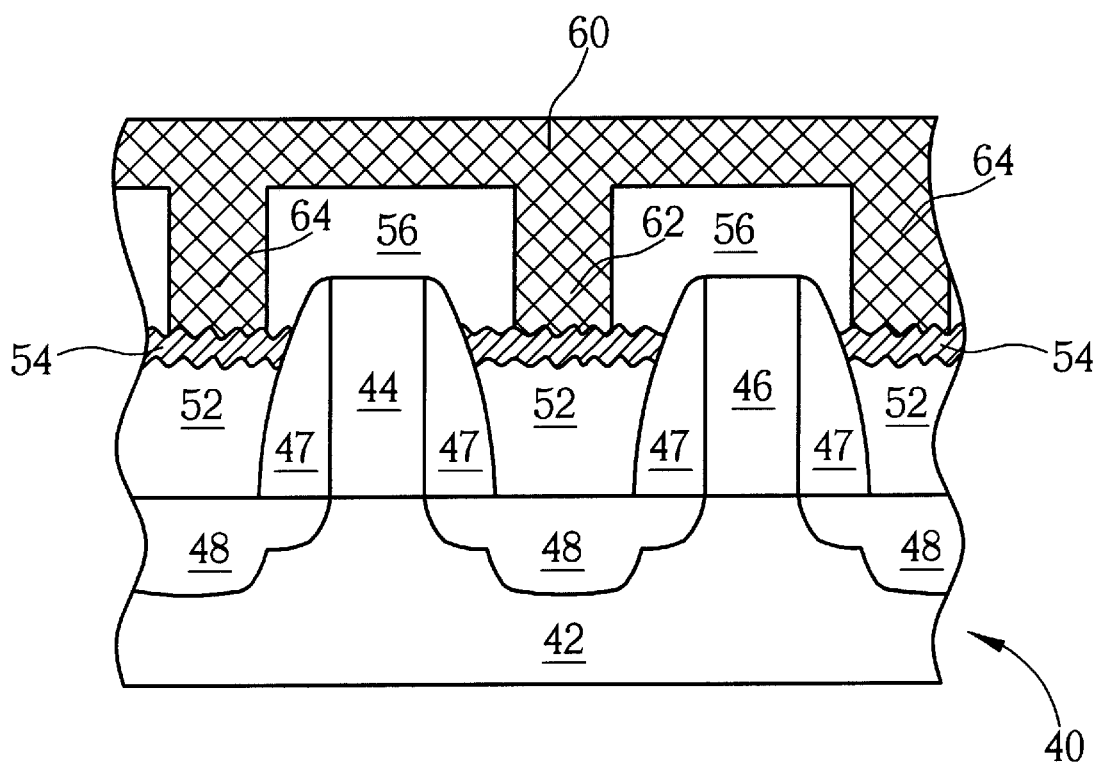

Please refer to FIG. 10 and FIG. 11. FIG. 10 and FIG. 11 are schematic diagrams for a method of forming a bit contact 62 and a node contact 64 on the landing pad shown in FIG. 9. After the landing pad is completed, a storage node of a capacitor of the memory cell or a bit line of the DRAM can be formed. As shown in FIG. 10, a first dielectric layer 56 is formed on the semiconductor wafer 40. Then, an etching process is performed on the first dielectric layer 56 to form at least one first contact hole 57 and a second contact hole 58 on a predetermined area of the landing pad.

Next, as shown in FIG. 11, a poly-silicon layer 60 is filled in the first contact hole 57 and the second contact hole 58 to be used as the contact plugs for electrically connecting the landing pad and the other devices. The contact plug positioned in the first contact hole 57 is used as a bit contact 62 over which the bit line of the DRAM is sequentially formed. The contact plug positioned in the second contact hole 58 is used as a node contact 64 over which the storage node of the capacitor of the memory cell is sequentially formed.

Figure 12:
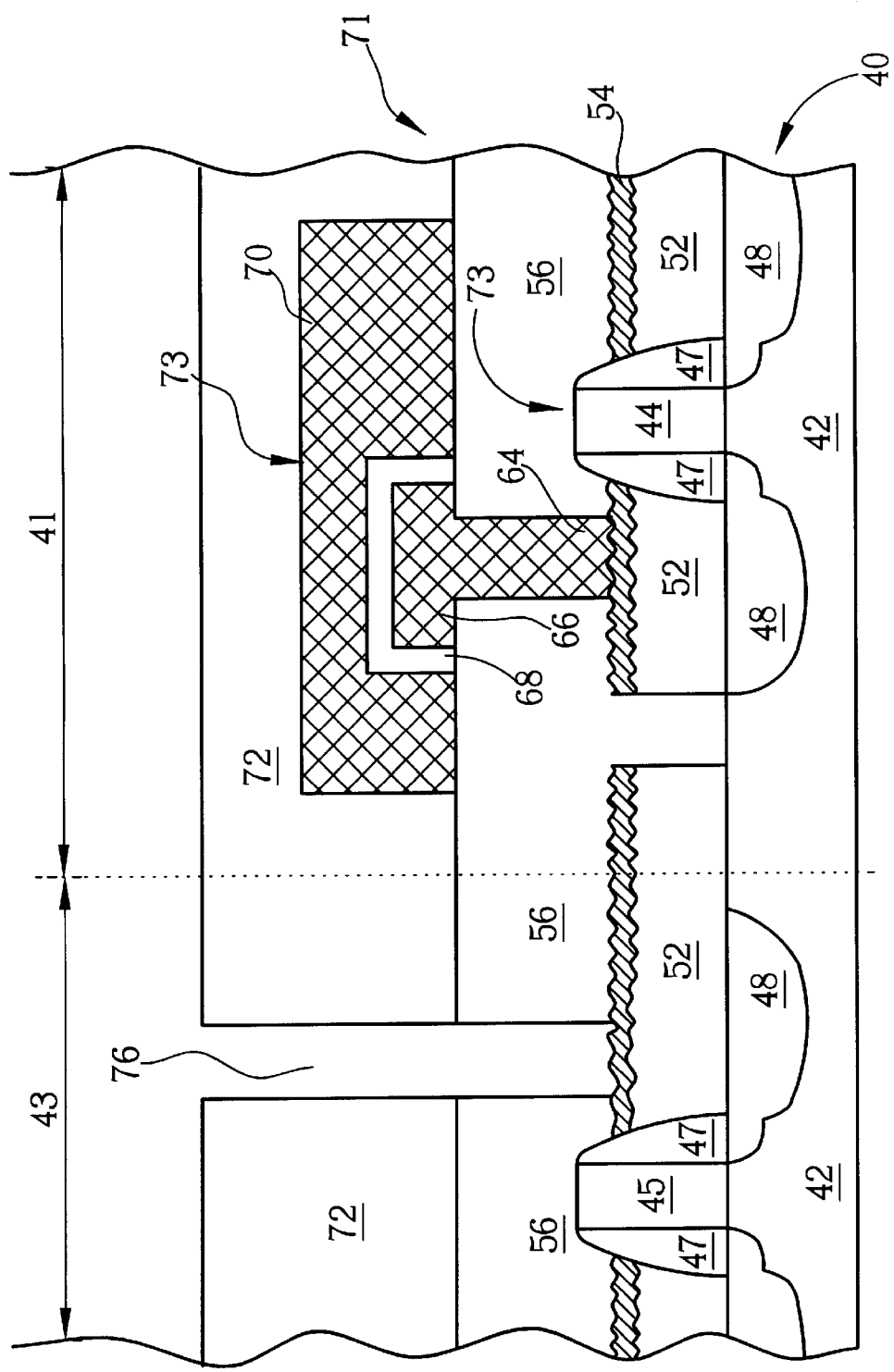
FIG. 12 is a schematic diagram of a capacitor formed on the node contact shown in FIG. 11.

Please refer to FIG. 12. FIG. 12 is a schematic diagram of a capacitor formed on the node contact 64 shown in FIG. 11. In the DRAM processing, the surface of the semiconductor wafer 40 is defined as an array area 41 where a plurality of memory cells are formed and a periphery area 43 where periphery circuits are formed. After the formation of the gates 44, 46 in the array area 41, at least one gate 45 in the periphery area 43, the conductive layer 52 and the silicide layer 54, a capacitor is formed in the array area 41. An interconnecting process is then performed to electrically connect the memory cells and the periphery circuits with external circuitry.

After the node contact 64 is completed in the array area 41, a bottom storage node 66, a second dielectric layer 68, and an upper field plate 70 are then sequentially formed. The bottom storage node 66, the second dielectric layer 68 and the upper field plate 70 form a capacitor 71. The gates 44, the landing pad, the node contact 64 and the capacitor 71 together form a memory cell 73.

Next, the interconnecting process is performed to form a third dielectric layer 72 on the semiconductor wafer 40, which is followed by an etching process. At least one plug hole (not shown) is formed within the third dielectric layer 72 in the array area 41 to be used as a channel for electrically connecting the specific device in the array area 41 and the sequentially formed interconnect above the specific device. At the same time, at least one contact hole 76 extending down to the silicide layer 54 is formed in the periphery area 43 to be used as a channel for electrically connecting the periphery circuits with external circuitry.

As the landing pad is formed of the conductive layer 52 and the silicide layer 54 on the predetermined area of the source or drain 48 of the MOS transistor 50, there is no need to use a specific photoresist layer to define the position of the landing pad. Also, the landing pad can be formed on the drain or source 48 of the MOS transistor 50 in the array area 41 and the periphery area 43 at the same time. This reduces the depth of the contact hole 76 in the periphery area 43 and increases the tolerance in defining the position of the bit contact (not shown) and the node contact 64. Therefore, the present invention method can not only lessen the difficulty in DRAM processing, but can also enhance both the performance and integration of the DRAM.

Figure 13:
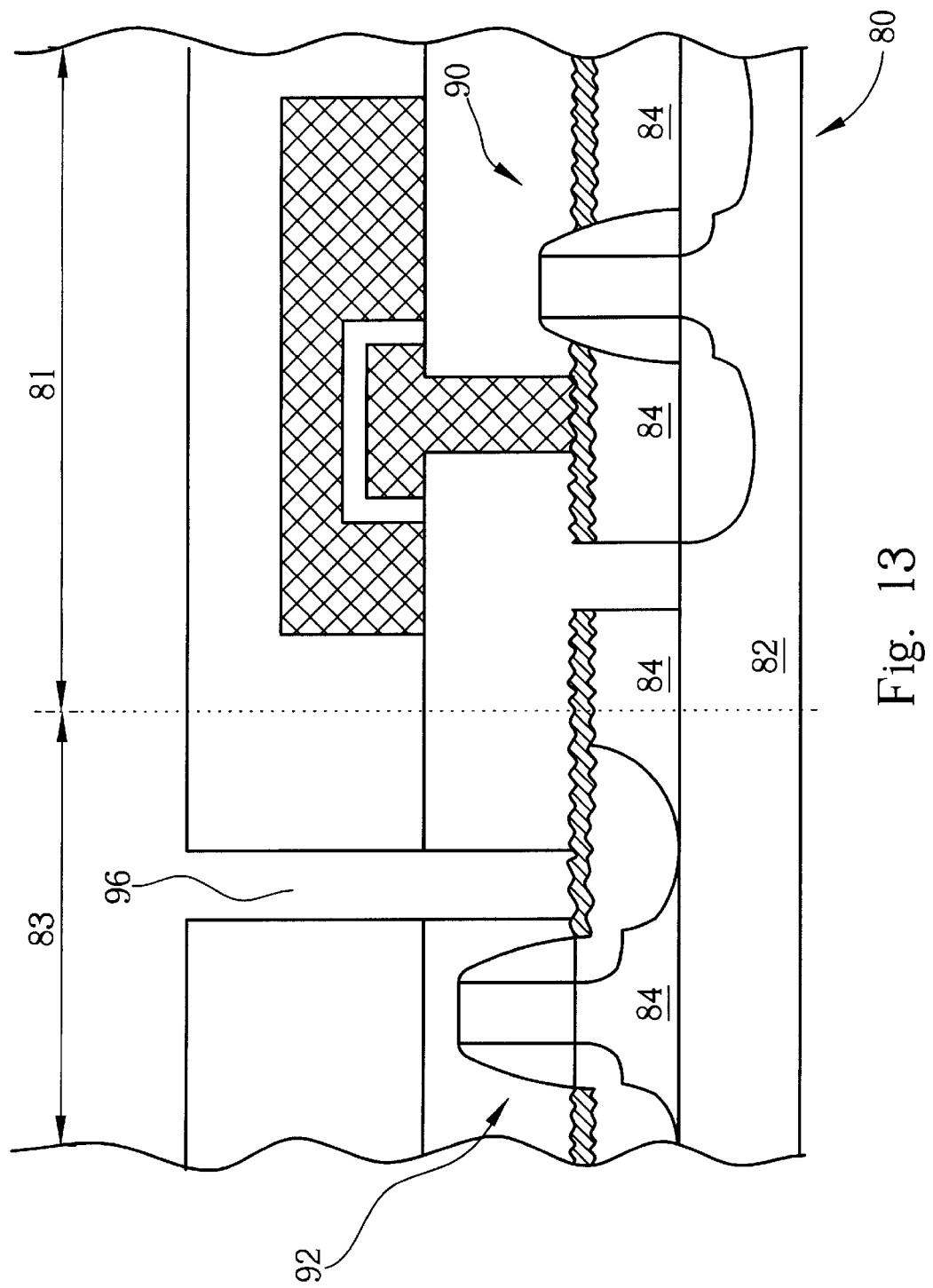
FIG. 13 is a schematic diagram of an alternative method according to the present invention.

Please refer to FIG. 13. FIG. 13 is a schematic diagram of an alternative method according to the present invention. The above-mentioned processing sequence can be changed to become another method to form the memory cells of the DRAM in an array area 81 and the periphery circuits in a periphery area 83 of a semiconductor wafer 80. A MOS transistor 90 is first formed in the array area 81. Then, an epitaxy layer 84 of uniform thickness is formed on a silicon substrate 82 of the semiconductor wafer 80. Next, another MOS transistor 92 and its related devices are formed on the epitaxy layer 84 in the periphery area 83. In this way, the epitaxy layer 84 can be used as a silicon substrate, increasing the surface height of the silicon substrate 82 in the periphery area 83. Consequently, the depth of a contact hole 96 formed in the periphery area 83 is reduced, which will reduce the length of a contact plug sequentially formed within it. This increases the yield of the entire process.

Compared to the prior art method of forming the landing pad 29, in the method of the present invention the conductive layer and the silicide layer evenly formed on the predetermined area of the silicon substrate are used as the landing pad on the drain or source of the MOS transistor. The height of the landing pad is lower than that of the spacer surrounding the periphery portion of the gate so that the spacer electrically isolates the gate and the conductive layer. This defines the position of the landing pad without the need for any lithographic processes and enhances the tolerance in defining the position of the bit contact and the node contact in the array area. Consequently, the difficulty of the DRAM process is decreased, increasing the performance and the integration of the DRAM.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a landing pad on the drain and source of a metal oxide semiconductor (MOS) transistor, the MOS transistor being formed on a silicon substrate of a semiconductor wafer and comprising a gate positioned on the silicon substrate with a spacer positioned around its periphery portion, a drain and a source formed on the surface of the silicon substrate and positioned at two opposite sides of the gate, the method comprising:

forming a conductive layer of an uniform thickness above each of the drain and source of the MOS transistor wherein the two conductive layers are used as the landing pads of the drain and source, and the height of each of the two conductive layers is lower than that of the spacer surrounding the periphery portion of the gate so that the gate and the two conductive layers are electrically isolated by the spacer.

2. The method of claim 1 wherein the MOS transistor is a pass transistor of a memory cell of a dynamic random access memory (DRAM).

3. The method of claim 2 wherein each of the landing pads is used for connecting a storage node of a capacitor of the memory cell or a bit line of the DRAM to the drain or source.

4. The method of claim 3 wherein a contact plug is positioned between one of the landing pads and the bit line for electrically connecting the landing pad to the bit line.

5. The method of claim 1 wherein the conductive layer is formed by a poly-silicon layer or an epitaxy layer.

6. The method of claim 5 wherein the conductive layer comprises IIIA-group dopants or VA-group dopants for reducing the resistance of the conductive layer.

7. The method of claim 6 wherein the IIIA-group dopant is boron (B) and the VA-group dopant is arsenic (As).

8. The method of claim 5 wherein a silicide layer is positioned on the surface of the conductive layer for reducing the sheet resistance of the conductive layer.

9. The method of claim 8 wherein the silicide layer is formed by tungsten silicon ($WSi_x$).

10. The method of claim 5 wherein the epitaxy layer formed on the semiconductor wafer is used for increasing the altitude of the surface of periphery circuits and reducing the length of a contact plug formed on the periphery circuits.

* * * * *